United States Patent
Bhuwalka et al.

(10) Patent No.: US 8,471,329 B2
(45) Date of Patent: Jun. 25, 2013

(54) TUNNEL FET AND METHODS FOR FORMING THE SAME

(75) Inventors: Krishna Kumar Bhuwalka, Asansol (IN); Gerben Doornbos, Leuven (BE); Matthias Passlack, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 112 days.

(21) Appl. No.: 13/298,075

(22) Filed: Nov. 16, 2011

(65) Prior Publication Data

US 2013/0119395 A1    May 16, 2013

(51) Int. Cl.
*H01L 29/78* (2006.01)

(52) U.S. Cl.
USPC ........... 257/327; 257/329; 257/345; 257/346; 257/E29.007; 257/E29.027; 257/E29.028

(58) Field of Classification Search
USPC .................. 257/327, 329, 345, 346, E29.007, 257/E29.027, E29.028
See application file for complete search history.

(56) References Cited

PUBLICATIONS

Verhulst et al., "Tunnel field-effect transistor without gate-drain overlap", Applied Physics Letters, 91, 053102, 3 pages, Jul. 2007.*
Seabaugh et al., "Low-voltage tunnel transistors for beyhond CMOS logic", Proceedings of the IEEE, vol. 98, No. 12, Dec. 2010, pp. 2095-2110.*
Ionescu et al., "Tunnel field-effect transistors as energy-efficient electronic switches", Nature, vol. 479, Nov. 2011, p. 329-337.*
Avci, U.E., et al., "Comparison of Performance, Switching Energy and Process Variations for the TFET and MOSFET in Logic," 2011 Symposium on VLSI Technology Digest of Technical Papers, pp. 124-125.
Bhuwalka, K.K., et al., "P-Channel Tunnel Field-Effect Transistors down to Sub-50 nm Channel Lengths," Japanese Journal of Applied Physics, vol. 45, No. 4B, 2006, pp. 3106-3109.
Mookerjea, S., et al., "Temperature-Dependent *I-V* Characteristics of a Vertical $In_{0.53}Ga_{0.47}As$ Tunnel FET," IEEE Electron Device Letters, vol. 31, No. 6, Jun. 2010, pp. 564-566.

* cited by examiner

*Primary Examiner* — Evan Pert
(74) *Attorney, Agent, or Firm* — Slater & Matsil, L.L.P.

(57) ABSTRACT

A tunnel field-effect transistor (TFET) includes a gate electrode, a source region, and a drain region. The source and drain regions are of opposite conductivity types. A channel region is disposed between the source region and the drain region. A source diffusion barrier is disposed between the channel region and the source region. The source diffusion barrier and the source region are under and overlapping the gate electrode. The source diffusion barrier has a first bandgap greater than second bandgaps of the source region, the drain region, and the channel region.

20 Claims, 10 Drawing Sheets

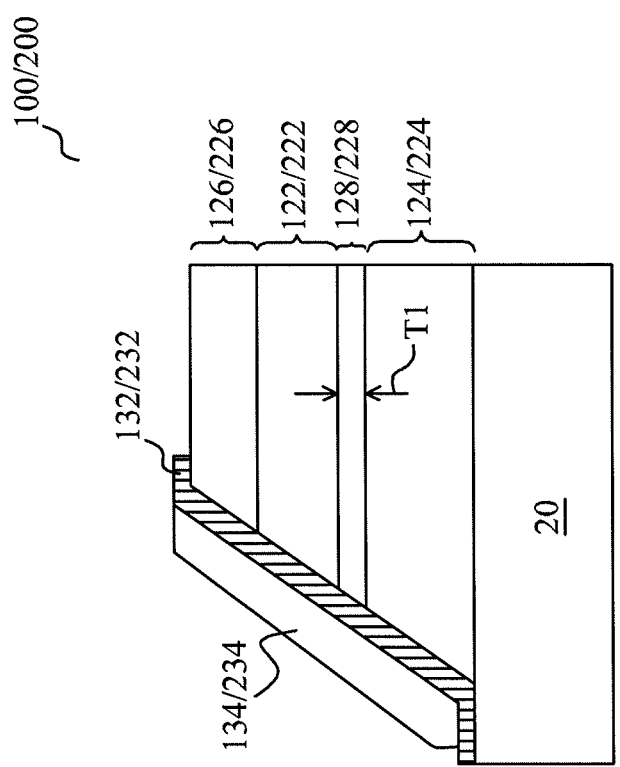

TUNNEL FET AND METHODS FOR FORMING THE SAME

BACKGROUND

Metal-Oxide-Semiconductor (MOS) technology has been used widely. A MOS device can work in three regions including a linear region, a saturation region, and a sub-threshold region, depending on the gate voltage $V_g$ and the source-drain voltage $V_{ds}$. The sub-threshold region is a region where voltage $V_g$ is smaller than the threshold voltage $V_t$. A parameter known as sub-threshold swing (SS) represents the easiness of switching the transistor current off, and is a factor in determining the speed of a MOS device. The sub-threshold swing can be expressed as a function of $m*kT/q$, where m is a parameter related to capacitance, k is the Boltzman constant, T is the absolute temperature, and q is the magnitude of the electrical charge on an electron. Previous studies have revealed that the sub-threshold swing of a typical MOS device has a limit of about 60 mV/decade at room temperature, which in turn sets a limit for further scaling of operational voltage VDD and threshold voltage $V_t$. This limitation is due to the diffusion transport mechanism of carriers. For this reason, existing MOS devices typically cannot switch faster than 60 mV/decade at room temperatures. The 60 mV/decade sub-threshold swing limit also applies to "Fin" Field Effect Transistor (FinFET) or ultra-thin-body MOSFET on silicon-on-insulator (SOI) devices. A FinFET comprises channels on the top surface and sidewalls of a fin. However, even with better gate control over the channel, an ultra-thin body MOSFET on SOI or FinFET can only achieve close to, but not below, the limit of 60 mV/decade. With such a limit, faster switching at low operational voltages for future nanometer devices cannot be achieved. To solve the above-discussed problem, Tunnel Field-Effect Transistors (TFETs) have been explored. In an existing MOSFET, the SS is limited by the diffusion of carriers over the source-to-channel barrier where the injection current is proportional to kT/q. Hence at room temperature, the SS is 60 mV/dec. In a TFET, injection is governed by the band-to-band tunneling from the valence band of the source to the conduction band of the channel. Since the current mechanism is tunneling determined, the current shows very weak temperature dependence, arising mainly due to band-gap changes with temperature. Accordingly, the SS is not limited by the temperature, and much lower SS can be achieved.

In TFETs, both the on-current and the off-current are determined by band-to-band tunneling from the valence band to the conduction band of the semiconductor material. Therefore, the on-current is generally limited by the band-bending in the channel. Various methods have been proposed to enhance the on-current, such as using a small band-gap source material to reduce tunneling barrier height and width, and also making tunnel FETs on narrow-band gap channel materials. Even though using narrow band-gap materials enhances the on-current exponentially, it has disadvantages. For example, the intrinsic carrier concentration in a semiconductor increases exponentially as a function of band-gap. The lower the band-gap, the higher the intrinsic carrier concentration at a given temperature is. This results in the higher off-state leakage currents.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3 is a cross-sectional view of a vertical tunnel FET in accordance with alternative embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Tunnel field-effect transistors (TFETs) are provided in accordance with various embodiments. Variations of the embodiments are discussed. Throughout various views and illustrative embodiments, like reference numbers are used to designate like elements.

Figure 1:
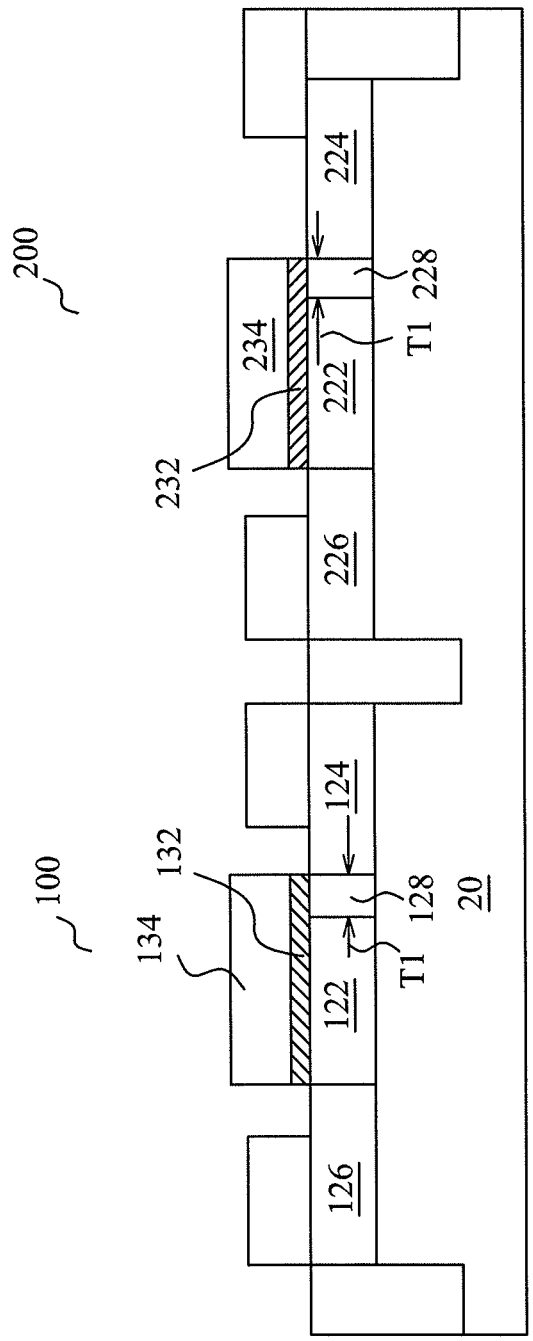
FIGS. 1 and 2 are cross-sectional views of planar tunnel field-effect transistors (FETs) in accordance with various embodiments.

FIG. 1 illustrates a cross-sectional view of an n-type FET (NFET) 100 and a p-type FET (PFET) 200, in accordance with some embodiments. NFET 100 and PFET 200 may be formed on substrate 20, which may be a semiconductor substrate comprising silicon, although other semiconductor materials may be used. Alternatively, substrate 20 may be a substrate for growing III-V compound semiconductor layers, and may be a sapphire substrate, for example.

Channel region 122, source region 124, and drain region 126 of NFET 100 include low-bandgap materials, which may be low-bandgap III-V compound semiconductor materials. The low-bandgap materials may have bandgaps lower than about 0.75 eV, or lower than about 0.5 eV, for example. Exemplary materials for forming channel region 122, source region 124, and drain region 126 include InAs, GaSb, InSb InGaAs, Ge, and the like. In an exemplary embodiment, InAs, which has a bandgap of about 0.36 eV, may be used for forming channel region 122, source region 124, and/or drain region 126. Alternatively, channel region 122, source region 124, and drain region 126 may comprise silicon, silicon germanium, or the like.

In some embodiments, drain region 126 is a heavily doped n-type (N+) region, which may have an n-type impurity concentration higher than about $10^{19}/cm^3$, or higher than about $10^{20}/cm^3$. Source region 124 is a heavily doped p-type (P+) region, which may have a p-type impurity concentration higher than about $10^{19}/cm^3$, or higher than about $10^{20}/cm^3$. The dopants in drain region 126 and source region 124 may depend on the materials of drain region 126 and source region 124, respectively. In the embodiments that drain region 126 and source region 124 comprise III-V compound semiconductor materials, the dopants may be selected from group IV elements including silicon, germanium, carbon, or the like. In the embodiments that drain region 126 and source region 124 include silicon, silicon germanium or the like, the dopants for forming drain region 126 may be n-type dopants such as phosphorus, arsenic, antimony, or the like. Further, the dopants for forming source region 124 may be p-type dopants such as boron, indium, or the like. In an exemplary embodiment that drain region 126 includes InAs, silicon or selenium may be doped. Drain region 126 and source region 124 may also be doped with carbon. Channel region 122 may be intrinsic without being doped to a p-type or an n-type. Alternatively, channel region 122 may be doped with a p-type or an n-type, and with a low doping concentration, for example, lower than about $10^{13}/cm^3$.

In some embodiments, source diffusion barrier 128 is formed between, and may be in physical contact with, channel region 122 and source region 124. In some embodiments, a thickness T1 of source diffusion barrier 128 is smaller than about 4 nm, or smaller than about 3 nm. Thickness T1 may be between about 0.5 nm and about 4 nm, or between about 1 nm and about 3 nm. Source diffusion barrier 128 may have a wide bandgap. In some embodiments, the wide bandgap is greater than the bandgaps of channel region 122, source region 124, and drain region 126 by a difference (ΔEg) greater than about 0.5 eV, or greater than about 1.0 eV. For example, source diffusion barrier 128 may include AlAsSb, which has the bandgap of about 1.84 eV, and channel region 122, source region 124, and drain region 126 may include AlAs, which has the bandgap of about 0.36 eV. The respective difference in bandgap ΔEg is about 1.48 eV. Furthermore, in some embodiments, to limit the electron leakage currents, it is desirable that the conduction band of source diffusion barrier 128 is higher than the conduction bands of channel region 122, source region 124, and drain region 126, with the conduction band offset ΔCB (illustratively shown in FIG. 8) being greater than about 0.5 eV, or greater than about 1.0 eV. In an exemplary embodiment, source diffusion barrier 128 includes AlAsSb, which may have a bandgap equal to about 1.84 eV. The valence band of source diffusion barrier 128 may also be lower than the valence bands of channel region 122, source region 124, and drain region 126, with the valence band offset ΔVB (illustratively shown in FIG. 8) being greater than about 0.5 eV. Source diffusion barrier 128 may be intrinsic without being doped as a p-type or an n-type. Alternatively, source diffusion barrier 128 may be doped as a p-type region or an n-type region.

Gate dielectric 132 and gate electrode 134 are formed over channel region 122 and source diffusion barrier 128. In some embodiments, gate electrode 134 overlaps an entirety of channel region 122 and an entirety of source diffusion barrier 128. Gate electrode 134 may, or may not, extend to directly over source region 124. On the drain side, gate electrode 134 may not extend to directly over drain region 126.

In FIG. 1, illustrative PFET 200 may have essentially the same structure as NFET 100, except the conductivity type of source region 224 is N+, while the conductivity type of drain region 226 is P+. Channel region 222, source region 224, and drain region 226 of PFET 200 may include low-bandgap materials. The low-bandgap materials of channel region 222, source region 224, and drain region 226 may be selected from the same available materials of channel region 122, source region 124, and drain region 126, respectively. The doping concentrations of channel region 222, source region 224, and drain region 226 may also be essentially the same as those of channel region 122, source region 124, and drain region 126, respectively. PFET 200 also includes source diffusion barrier 228, which also includes a wide bandgap material with the bandgap and the conduction band greater than the bandgaps and conduction bands, respectively, of channel region 222, source region 224, and drain region 226. The valence band of source diffusion barrier 228 may also be lower than the valence bands of channel region 222, source region 224, and drain region 226.

Gate dielectric 232 and gate electrode 234 are formed over channel region 222 and source diffusion barrier 228. In some embodiments, gate electrode 234 overlaps an entirety of channel region 222 and an entirety of source diffusion barrier 228. Gate electrode 234 may, or may not, extend to directly over source region 224. On the drain side, gate electrode 234 may not extend to directly over drain region 226.

Figure 8:
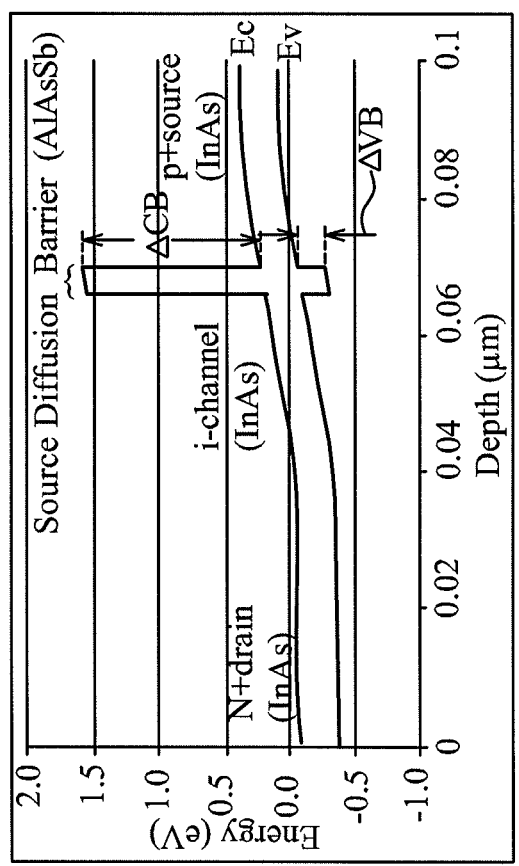

Table 1 lists some exemplary combinations of materials that may be used in the source/drain regions and channel regions of NFET 100 and PFET 200, in accordance with some embodiments. Each row of Table 1 lists one of the combinations of materials. The conduction band offsets ΔCB shown in FIG. 8 are the differences between the conduction bands of source diffusion barriers 128/228 and the conduction bands of source regions 124/224, drain regions 126/226, and channel regions 122/222. The valence band offsets ΔVB are the differences between the valence bands of source diffusion barriers 128/228 and the conduction bands of source regions 124/224, drain regions 126/226, and channel regions 122/222. In some embodiments, large conduction band offsets and large valence band offsets help reduce the leakage currents of the tunnel FETs. The combinations listed in table 1 are examples. Other combinations are within the scope of various embodiments.

TABLE 1

| Source/Drain/<br>Channel<br>Material | Source<br>Diffusion<br>Barrier Material | Conduction<br>Band Offset<br>ΔCB | Valence<br>Band Offset<br>ΔVB |
|---|---|---|---|
| InAs | AlAs$_x$Sb$_{(1-x)}$ | Large | Small |
| InAs | ZnTe | Large | Large |
| GaSb | AlSb | Large | Large |
| GaSb | ZnTe | Large | Large |
| InSb | CdTe | Medium | Large |
| InGaAs | InP | Medium | Medium |
| Ge | Si | Medium | Medium |

Figure 2:
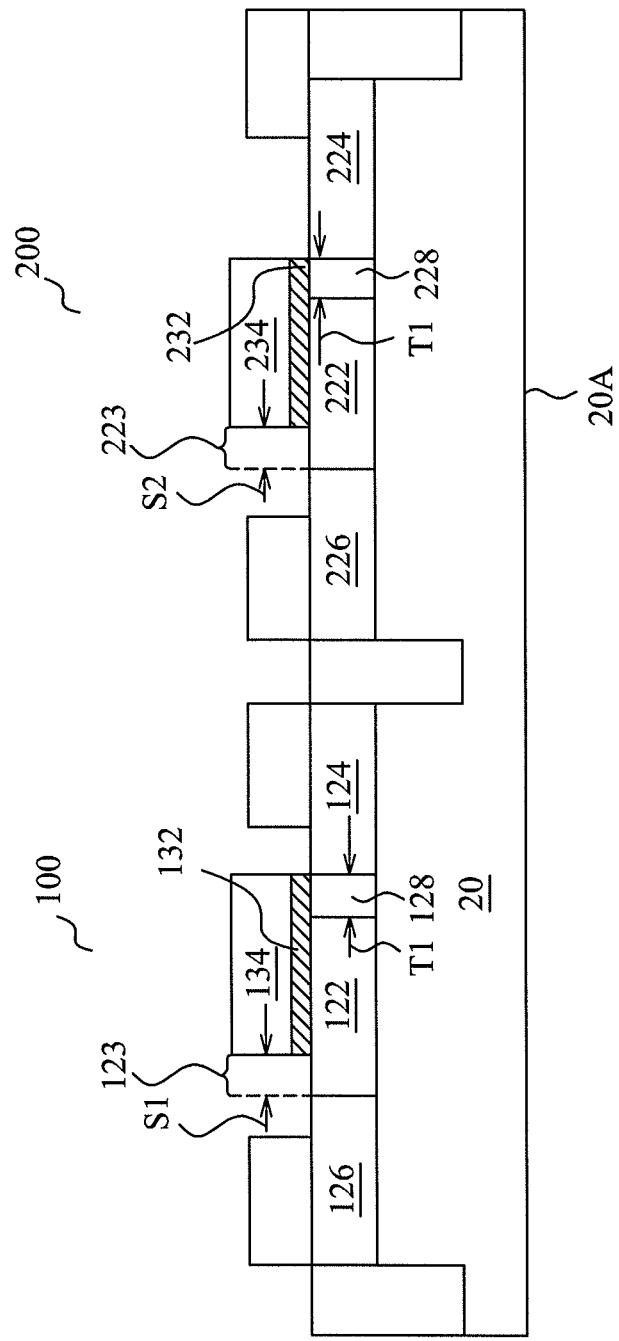

FIG. 2 illustrates NFET 100 and PFET 200 in accordance with alternative embodiments. Compared with FIG. 1, FIG. 2 illustrates that channel region 122 includes portion 123 (which is on the drain side) that does not have gate electrode 134 formed directly over it. Similarly channel region 222 includes portion 223 (which is on the drain side) that does not have gate electrode 234 formed directly over it. Alternative stated, gate electrode 134 in FIG. 2 does not cover the entire channel region 122. Further, the boundary of channel region 122 and drain region 126 is spaced apart from the nearest side edge of gate electrode 134 by spacing S1. Spacing S1 may be between about 2 nm and about 100 nm, for example. Similarly, gate electrode 234 does not extend to a portion of channel region 222, and the boundary of between channel region 222 and drain region 226 is spaced apart from the nearest side edge of gate electrode 234 by spacing S2. Spacing S2 may be between about 2 nm and about 100 nm, for example, in accordance with some embodiments.

NFETs 100 and PFETs 200 shown in FIGS. 1 and 2 are planar FET devices that are disposed horizontally. For example, the source region, the drain region, and the channel region of each of NFETs 100 and PFETs 200 are on substantially a same level parallel to major surface 20A of substrate 20. FIG. 3 illustrates the cross-sectional view of NFET 100 or PFET 200 having a vertical structure. In the embodiments shown in FIG. 3, source region 124/224, source diffusion barrier 128/228, channel region 122/222, and drain region 126/226 are stacked vertically. Although the illustrated embodiments show that source region 124 or 224 is at the bottom, the order of the stacked regions may also be reversed, and drain regions 126/226 may be at the bottom. Gate dielectric 132/232 is formed on the sidewalls of source region 124/224, source diffusion barrier 128/228, channel region 122/222, and drain region 126/226. Furthermore, gate electrode 134/234 is formed on gate dielectric 132/232. Similar to the embodiments shown in FIGS. 1 and 2, portions of the drain-side channel regions may not be covered by the corresponding overlying gate electrode 134/234.

Figure 4A:
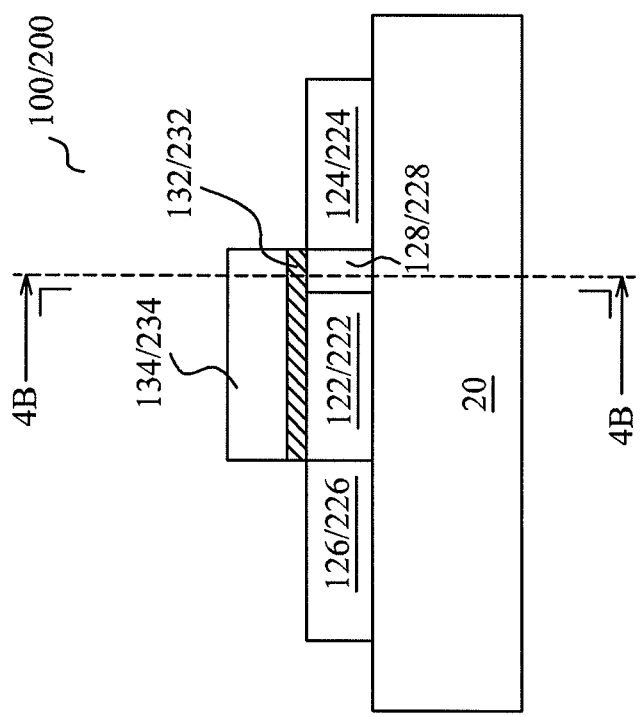
FIGS. 4A and 4B are cross-sectional views of a tunnel FinFET in accordance with yet other embodiments.
Figure 4B:
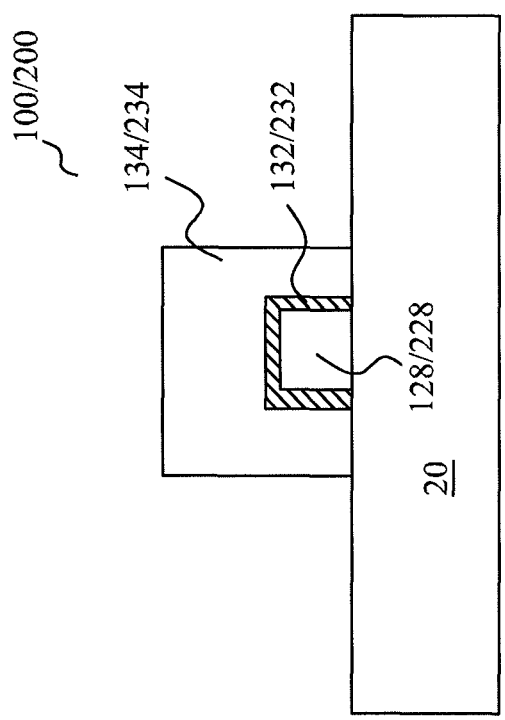

FIGS. 4A and 4B illustrate cross-sectional views of a tunnel FET in accordance with some other embodiments, wherein the cross-sectional view in FIG. 4B is obtained from the plane crossing line 4B-4B in FIG. 4A. With reference to FIGS. 4A and 4B, a semiconductor fin, which includes channel region 122/222 and source diffusion barrier 128/228, is formed over a top surface of substrate 20. Gate dielectric 132/232 and gate electrode 134/234 are formed on the top surface and sidewalls of semiconductor fin 122/222/128/228. The materials of channel region 122/222, source diffusion barrier 128/228, source region 124/224, and drain region 126/226 may be selected by referring to the embodiments shown in FIGS. 1 and 2.

Figure 5:
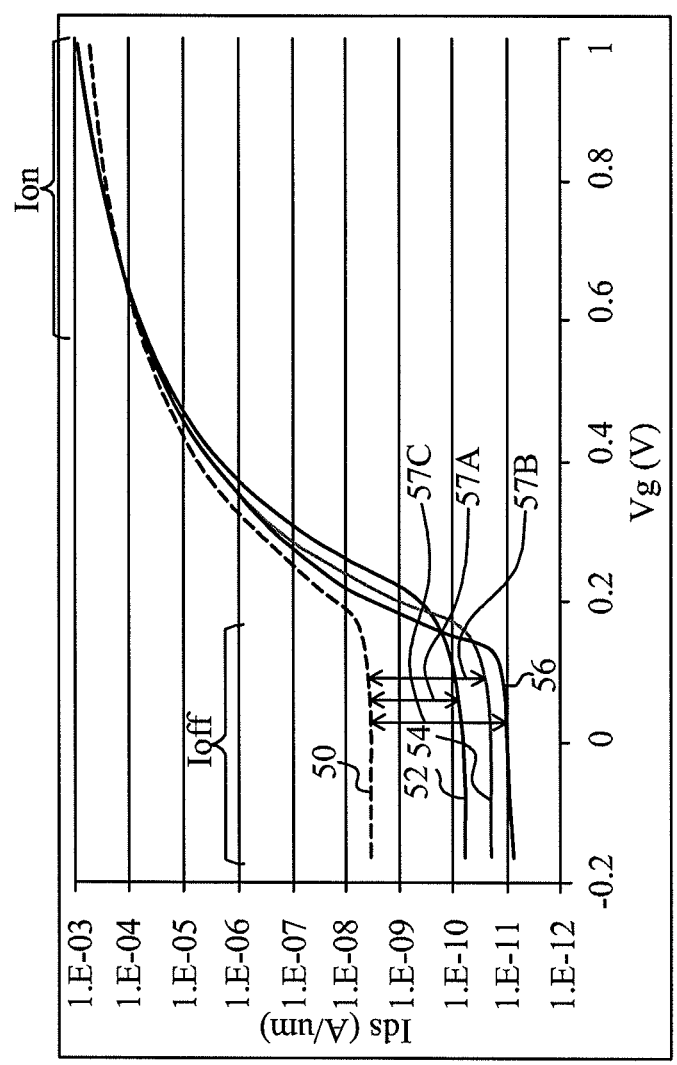
FIGS. 5 through 9 illustrate simulation results obtained from the tunnel FETs comprising thin source diffusion barriers, in accordance with some embodiments.

By forming the source diffusion barrier 128/228, the current that leaks ("leakage current") when the tunnel FET is off flows between source region 124/224 and drain region 126/226, and is reduced. FIG. 5 shows illustrative simulation results, wherein source-drain currents Ids are illustrated as a function of gate voltages Vg. Line 50 corresponds to the tunnel FET with no source diffusion barrier. Lines 52, 54, and 56 are obtained from tunnel FETs having diffusion barriers thicknesses (Tb) of 2 nm, 3 nm, and 4 nm, respectively. The simulation was performed assuming the tunnel FETs are operated at a temperature of 300 K, with the drain-to-source voltage being 0.5V. In some embodiments, the formation of the source diffusion barriers results in a significant reduction in the leakage currents Ioff. In the example of FIG. 5, current Ioff is measured when gate voltage Vg is close to 0V, for example, between −0.1V and 0.1V. In this range, the leakage reduction is close to two orders or higher. For example, the leakage reductions are marked as 57A, 57B, and 57C, wherein the magnitudes corresponding to 57A, 57B, and 57C represent two orders or higher of currents Ids in FIG. 5. On the other hand, the on-current Ion marked in FIG. 5 of the tunnel FETs with 2 nm, 3 nm, and 4 nm source diffusion barriers are substantially the same as the tunnel FET with no source diffusion barrier. For example, when gate voltage Vg is between about 0.6V and 0.8V, the corresponding Ids values, which are on-currents, of lines 52, 54, and 56 are substantially the same. This indicates that the introduction of source diffusion barrier does not have a significant impact on the on-currents.

Figure 6:
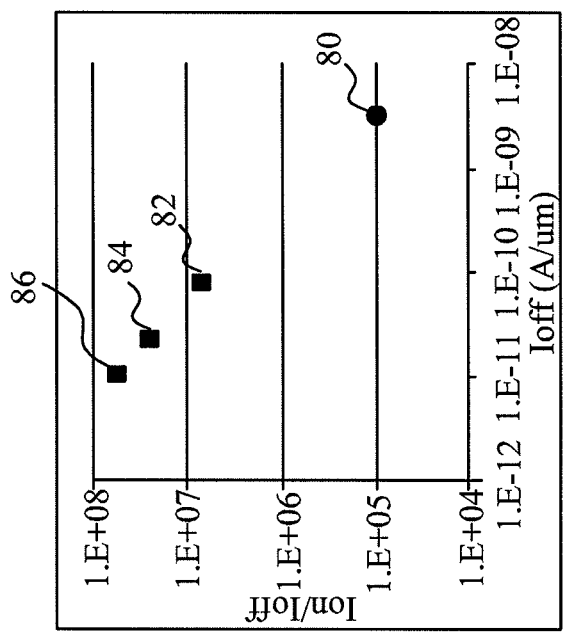

FIG. 6 illustrates the simulation results which show ratios Ion/Ioff ratios of various sample tunnel FETs as a function of leakage currents, in accordance with some embodiments. Point 80 is obtained from the tunnel FET with no source diffusion barrier. Points 82, 84, and 86 are obtained from the tunnel FETs with 2 nm, 3 nm, and 4 nm source diffusion barriers, respectively. In some embodiments, the tunnel FETs represented by points 82, 84, and 86 that have the source diffusion barriers have significantly greater Ion/Ioff ratios than the Ion/Ioff ratio of the tunnel FET that is represented by point 80 and that has no source diffusion barrier.

Figure 7:
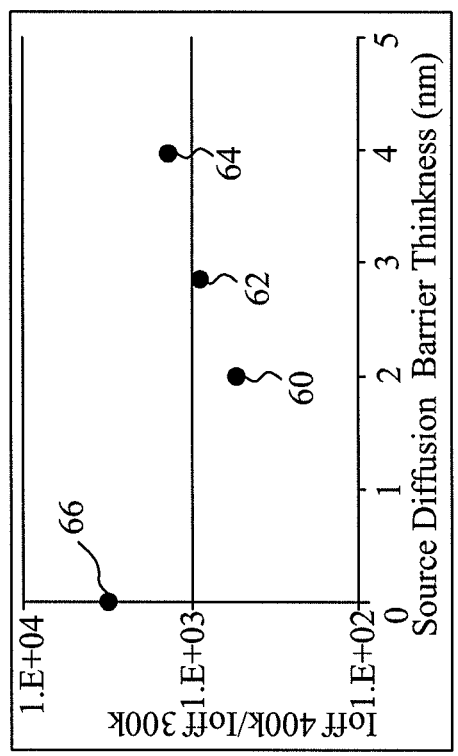

FIG. 7 illustrates the leakage current ratios as a function of the thicknesses of the diffusion barrier layers, in accordance with some embodiments. In FIG. 7, the Y axis represents the leakage current ratios, which are the ratios of leakage currents Ioff of tunnel FETs at an operational temperature of 400K to the corresponding leakage currents Ioff of the respective tunnel FETs at an operational temperature of 300K. The results in FIG. 7 are simulation results in accordance with some embodiments. As illustratively shown in FIG. 7, with the increase in the operational temperature, the leakage current ratios also increase. For example, the illustrated leakage current ratios of points 60, 62, and 64 are all greater than 1. Smaller leakage current ratios represented by the Y-axis values indicate that the increase in the leakage currents with the increase in temperature is smaller. For example, point 66 corresponds to the leakage current ratio equal to about 5.0E+03, indicating that when the temperature increases from 300K to 400K, the leakage current increases by 5.0E+03 times, or 5,000 times. As a comparison, point 62 corresponds the leakage current ratio equal to about 1.0E+03, indicating that when the temperature increases from 300K to 400K, the leakage current increases by 1.0E+03 times, or 1,000 times, which is smaller than 5,000 times. The respective tunnel FET is more stable, and is affected less by the temperature. The reason is that a small leakage current ratio indicates that when the operational temperature of the corresponding device increases, the increase in the leakage current increases is smaller. Therefore, the tunnel FETs that have smaller leakage current ratios are desirable. The results in FIG. 7 reveal that the leakage current ratios of the tunnel FET having 2 nm, 3 nm, and 4 nm diffusion barrier layers represented by respective points 60, 62, and 64 are significantly smaller than the leakage current ratio of the tunnel FET with no source diffusion barrier represented by point 66). The diffusion barrier layers are similar to diffusion barrier layers 128 and 228 of FIG. 2. This indicates that the tunnel FETs in some embodiments are less sensitive to the change in operation temperatures than tunnel FETs having no source diffusion barriers. Less temperature sensitivity is due to the wide band-gap source diffusion barrier that increases the activation energy.

FIG. 8 illustrates exemplary bandgaps of channel region 122, source region 124, drain region 126, and source diffusion barrier 128 of tunnel NFET 100, in accordance with some embodiments. The exemplary materials for forming NFET 100 are denoted in FIG. 8. In some embodiments, the conduction band offset $\Delta CB$ results in an effective barrier for electrons diffusion current since the electrons have to overcome a higher energy barrier. For example, when a leaked electron travels from the source to the drain, the electron needs to have an energy level higher than the conduction band energy of the source diffusion barrier. In some embodiments, the leaked electron needs to overcome the conduction band offset $\Delta CB$ illustratively shown in FIG. 7. In contrast, the valence band offset $\Delta VB$ results in an effective barrier for hole diffusion current since the holes have to overcome higher energy barrier. For example, when a leaked hole travels from the source to the drain, the electron needs to have an energy level lower than the valence band energy of the source diffusion barrier. In some embodiments, the leaked hole needs to overcome the valence band offset $\Delta VB$ illustratively shown in FIG. 7. The electrons and holes that fail to meet the value requirements shown in FIG. 7 will not be leaked. Accordingly, the leakage currents of the tunnel FETs in accordance with various embodiments may be reduced due to the added conduction band offset $\Delta CB$ and/or added valence band offset $\Delta VB$. The reason is that those electrons failing to overcome the conduction band offset $\Delta CB$ cannot cross through the source diffusion barrier, and hence will not form a part of the leakage current. Similarly, those electrons failing to overcome the valence band offset $\Delta VB$ cannot cross through the source diffusion barrier, and hence will not form a part of the leakage current.

Figure 9:
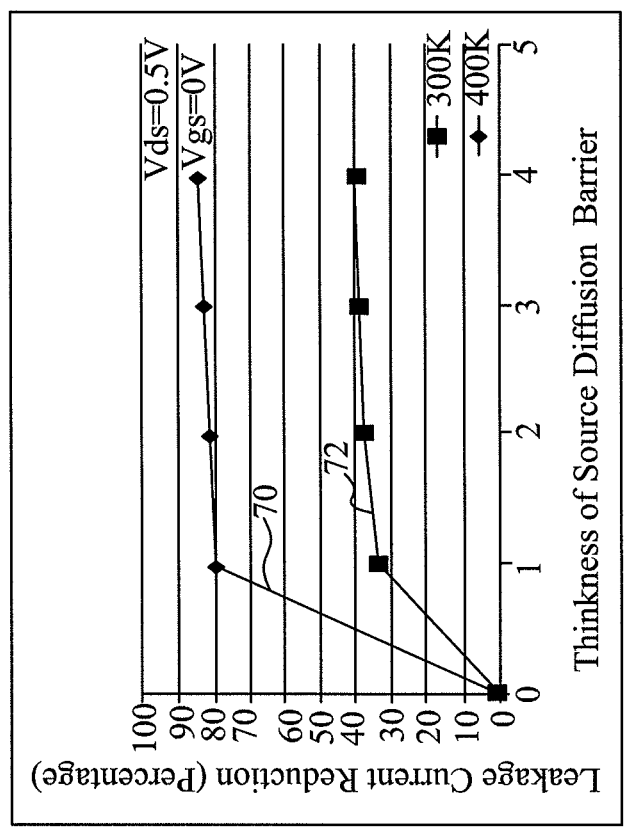

FIG. 9 illustrates the leakage current reduction as a function of the thicknesses of source diffusion barriers, compared to tunnel FETs with no source diffusion barriers. Lines 70 and 72 are obtained by simulating the device behavior at operational temperatures equal to 400K and 300K, respectively. The simulation was performed assuming the drain-to-source voltage Vds is 0.5 V, and the gate-to-source voltage Vgs is 0V. In some embodiments, adding the source diffusion barrier with a small thickness, such as thickness T1 in FIGS. 2 and 3 being 2 nm and below), causes a significant reduction in leakage currents. However, with the increase in the thicknesses of the source diffusion barriers, the reduction starts to saturate, for example, when the thicknesses of the source diffusion barriers are greater than about 2 nm or about 3 nm. By comparing lines 70 and 72, it is found that lines 70 and 72 show the same phenomenon. For example, the reduction of leakage currents is affected by the thicknesses of the source diffusion barriers regardless of whether the operation temperature is 300K or 400K. Furthermore, the reduction of the leakage currents starts to saturate when the thicknesses of the source diffusion barriers are about 1 nm or higher, regardless of whether the operational temperature is 300K or 400K. Therefore, FIG. 9 reveals that the reduction of leakage currents caused by the source diffusion barriers is stable, and is not affected significantly by operational temperatures of the respective tunnel FETs.

Further, in the illustrated exemplary embodiments shown in FIG. 9, lines 70 and 72 become substantially flat, indicating that the reduction in the leakage currents is substantially saturated when the thickness of the source diffusion barrier reaches about 3 nm.

In accordance with embodiments, a tunnel FET includes a gate electrode, a source region, and a drain region, wherein the source and drain regions are of opposite conductivity types. A channel region is disposed between the source region and the drain region. A source diffusion barrier is disposed between the channel region and the source region. The source diffusion barrier and the source region are under and overlapping the gate electrode. The source diffusion barrier has a first bandgap greater than second bandgaps of the source region, the drain region, and the channel region.

In accordance with other embodiments, a tunnel FET includes a source region and a drain region, wherein the source and drain regions are of opposite conductivity types. A channel region is disposed between the source region and the drain region. A source diffusion barrier with a thickness smaller than about 3 nm is disposed between the channel region and the source region. Each of the source region, the drain region, the channel region, and the source diffusion barrier comprises a III-V compound semiconductor material.

In accordance with yet other embodiments, a tunnel FET includes a gate electrode, a source region and a drain region, wherein the source and drain regions are of opposite conductivity types. A channel region is disposed under the gate electrode and between the source region and the drain region. A source diffusion barrier spaces the channel region apart from the source region, wherein a distance between the channel region and the source region is smaller than about 3 nm. The source diffusion barrier has a conduction band greater than conduction bands of the source region, the drain region, and the channel region. A valence band of the source diffusion barrier is lower than the valence bands of the source region, the drain region, and the channel region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A tunnel field-effect transistor (TFET) comprising:
a gate electrode;
a source region;
a drain region, wherein the source and drain regions are of opposite conductivity types;
a channel region between the source region and the drain region; and
a source diffusion barrier between the channel region and the source region, wherein the source diffusion barrier and the source region are under and overlapping the gate electrode, and wherein the source diffusion barrier has a first bandgap greater than second bandgaps of the source region, the drain region, and the channel region.

2. The TFET of claim 1, wherein the source diffusion barrier has a thickness smaller than about 3 nm.

3. The TFET of claim 1, wherein a difference between the first bandgap and the second bandgap is equal to or greater than about 1.48 eV.

4. The TFET of claim 1, wherein an edge of the gate electrode is substantially aligned with a boundary of the drain region and the channel region.

5. The TFET of claim 1, wherein a boundary of the drain region and the channel region is spaced apart from a nearest edge of the gate electrode.

6. The TFET of claim 1, wherein the source region, the drain region, the channel region, and the source diffusion barrier comprise III-V compound semiconductor materials.

7. The TFET of claim 6, wherein the source region, the drain region, and the channel region comprise InAs, and wherein the source diffusion barrier comprises AlAsSb.

8. A tunnel field-effect transistor (TFET) comprising:
a source region;
a drain region, wherein the source and drain regions are of opposite conductivity types;
a channel region between the source region and the drain region; and
a source diffusion barrier between the channel region and the source region, wherein each of the source region, the drain region, the channel region, and the source diffusion barrier comprises a III-V compound semiconductor material.

9. The TFET of claim 8 further comprising a gate electrode over the channel region, wherein the source diffusion barrier overlaps the gate electrode.

10. The TFET of claim 8, wherein the TFET is an n-type FET, and wherein the source region is of p-type, and the drain region is of n-type.

11. The TFET of claim 8, wherein the TFET is a p-type FET, and wherein the source region is of n-type, and the drain region is of p-type.

12. The TFET of claim 8, wherein the source diffusion barrier has a thickness less than about 3 nm.

13. The TFET of claim 8, wherein the TFET is a planar FET device.

14. The TFET of claim 8, wherein the TFET is a FinFET, wherein the channel region and the source diffusion barrier form a fin, and wherein the FinFET further comprises a gate electrode formed on a top surface and sidewalls of the channel region and the source diffusion barrier.

15. A tunnel field-effect transistor (TFET) comprising:
- a gate electrode;
- a source region;
- a drain region, wherein the source and drain regions are of opposite conductivity types;
- a channel region under the gate electrode and between the source region and the drain region; and
- a source diffusion barrier spacing the channel region apart from the source region, wherein the source diffusion barrier has:
  - a first conduction band greater than second conduction bands of the source region, the drain region, and the channel region; and
  - a first valence band lower than second valence bands of the source region, the drain region, and the channel region.

16. The TFET of claim 15, wherein each of the source region, the drain region, the channel region, and the source diffusion barrier comprises a III-V compound semiconductor material.

17. The TFET of claim 16, wherein the source region, the drain region, and the channel region comprise InAs, and wherein the source diffusion barrier comprises AlAsSb.

18. The TFET of claim 15, wherein the source diffusion barrier has a first bandgap, the source region, the drain region, and the channel region have second bandgaps, and wherein difference between the first bandgap and the second bandgaps are equal to or greater than about 1.48 eV.

19. The TFET of claim 15, wherein an edge of the gate electrode is substantially aligned with a boundary of the drain region and the channel region, and wherein the source diffusion barrier and the channel region are under and overlapping the gate electrode.

20. The TFET of claim 15, wherein a boundary of the drain region and the channel region is spaced apart from a nearest edge of the gate electrode, and wherein the source diffusion barrier and the channel region are under and overlap the gate electrode.

* * * * *